United States Patent [19]

Furuta

[11] Patent Number: 4,928,423
[45] Date of Patent: May 29, 1990

[54] FISHHOOK AND METHOD FOR PRODUCING THE SAME

[76] Inventor: Yoshikazu Furuta, 116, Takiro-cho 6-chome, Tajimi-shi, Gifu-ken, Japan

[21] Appl. No.: 383,301

[22] Filed: Jul. 17, 1989

Related U.S. Application Data

[63] Continuation-in-part of Ser. No. 222,081, Jul. 20, 1988, abandoned.

[51] Int. Cl.$^5$ ............................................. A01K 97/02
[52] U.S. Cl. .................................................. 43/43.16
[58] Field of Search ................... 43/43.16, 42.53; 29/9

[56] References Cited

U.S. PATENT DOCUMENTS

| | | | |
|---|---|---|---|
| 1,838,981 | 12/1931 | Anderson | 43/43.16 |
| 3,656,995 | 4/1972 | Reedy, Jr. | 427/249 |
| 4,237,184 | 12/1980 | Gonseth et al. | 427/249 |
| 4,284,687 | 8/1981 | Dreyer et al. | 427/249 |
| 4,341,834 | 7/1982 | Kikuchi et al. | 427/249 |
| 4,442,169 | 4/1984 | Graham | 427/249 |
| 4,463,033 | 7/1984 | Kikuchi et al. | 427/249 |
| 4,497,874 | 2/1985 | Hale | 427/249 |
| 4,715,142 | 12/1987 | Richard | 43/43.16 |

FOREIGN PATENT DOCUMENTS

| | | | |
|---|---|---|---|
| 57-864 | 4/1982 | Japan | 427/249 |
| 7904556 | 12/1980 | Netherlands | 43/43.16 |

*Primary Examiner*—Kurt Rowan
*Attorney, Agent, or Firm*—Cushman, Darby & Cushman

[57] ABSTRACT

A fishhook is composed of a base member formed of carbon steel, stainless steel or the like and a TiC film layer formed on the surface of the base member by chemical vapor deposition. This fishhook is produced by heating the cleaned base member in hydrogen gas to activate the surface of the cleaned base member and heating the activated base member in a high temperature mixture gas of evaporation gas of titanium tetrachloride with hydrogen gas and methane gas at about 1000° C. to form the TiC film layer exhibiting excellent abrasion resistance on the base member.

13 Claims, 1 Drawing Sheet

FISHHOOK AND METHOD FOR PRODUCING THE SAME

This is a continuation-in-part of application Ser. No. 222,081, filed July 20, 1988, which was abandoned.

BACKGROUND OF THE INVENTION

1. Field of the Invention

The present invention relates to a fishhook having improved abrasion resistance and corrosion resistance and a method for producing the same.

2. Description of the Prior Art

Conventionally, the fishhook has been produced by processing a rod like member made of carbon steel, stainless steel or the like. And in order to increase the hardness of the fishhook, especially a point and a barb thereof, quenching has been performed, and then in order to give corrosion resistance, surface treatment such as plating with chrome, gold, brass or the like has been performed.

However, in the above described conventional fishhook, pores of the surface thereof are not completely closed so that corrosion resistance is insufficient. Moreover, the conventional fishhook is also short of abrasion resistance. Accordingly, the conventional fishhook has the following problems.

Namely, in the case that the conventional fishhooks are transported by sea, they sometimes become rusty due to sea breeze or the like even if they are well packed. And in the case that the conventional fishhooks are stored over a long period, they sometimes become rusty because of shortness of corrosion resistance even if considerable care is taken to prevent the generation of rust.

Moreover, the shortness of abrasion resistance causes the abrasion of the point and a sharpened portion of the barb. This incurs such problems that fish are not caught in fishing and that bait is easily taken off of the fishhook.

SUMMARY OF THE INVENTION

It is an object of the present invention to provide fishhooks having improved abrasion resistance and corrosion resistance.

It is another object of the present invention to provide a method for producing fishhooks having improved abrasion resistance and corrosion resistance with good work efficiency.

The fishhook according to the present invention is composed of a base member made of steel and provided with a point, a barb and a bend, and at least one film layer made of hard metallic compound and formed on a surface of the base member by chemical vapor deposition.

This chemical vapor deposition is effected with good work efficiency by contacting a mixture gas containing evaporation gas of metal halide with the base member of a fishhook like shape within a high temperature furnace of about 800° C. to 1000° C.

Due to this chemical vapor deposition, a single film layer or multiple film layers of titanium carbide (TiC), titanium nitride (TiN), a solid solution of titanium carbide and titanium nitride [Ti(C,N)], aluminum oxide ($Al_2O_3$) or the like, each of which is dense and has a uniform thickness, can be formed on the surface of the base member with good adhesion.

DETAILED DESCRIPTION OF THE EMBODIMENTS

Figure 1:
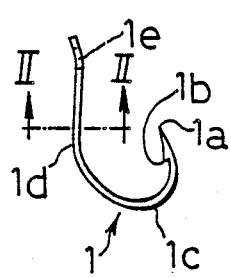
FIG. 1 is a front view of one example of a fishhook according to the present invention.

As shown in FIG. 1, a fishhook 1 is provided with a point 1a, a barb 1b, a band 1c, a shank 1d and an eye 1e.

Figure 2A:
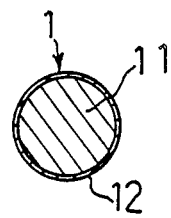
FIGS. 2(A), 2(B), and 2(C) are sectional views taken along the line II—II of FIG. 1, respectively, each of which illustrates an embodiment of the fishhook according to the present invention.

As shown in FIG. 2(A), the fishhook 1 is composed of a base member 11 formed into a fishhook-like shape and a film layer 12 formed on a surface of the base member 11 by chemical vapor deposition. The base member 11 is made of carbon steel, stainless steel or the like similarly to the conventional fishhooks. And the film layer 12 is made of hard metallic compound such as TiC, TiN, Ti(C,N) and $Al_2O_3$.

In forming the TiC film layer, at first, the base member 11 is cleaned. Then, the cleaned base member 11 is heated in hydrogen gas to remove remaining oxide from the surface of the base member 11 and activate the surface thereof. Next, the activated base member 11 is heated in a high temperature mixture gas of evaporation gas of titanium tetrachloride as metal halide with hydrogen gas and methane gas at about 1000° C. In this step, the mixture gas reacts on the surface of the base member 11 to form the TiC film layer thereon. TiC shows dull gray and has a hardness (Hv) of 3200 at a normal temperature. Accordingly, it exhibits excellent abrasion resistance. The obtained TiC film layer 12 is firmly joined to the base member 11.

In forming the TiN film layer, the base member 11 is cleaned and activated. Then, the activated base member 11 is heated in a mixture gas of evaporation gas of titanium tetrachloride with hydrogen gas and nitrogen gas at about 800° to 850° C. This results in the mixture gas reacting on the surface of the base member 11 to form the TiN film layer thereon preferably of 1 to 10 microns in thickness. TiN shows shiny gold and has a hardness (Hv) of 2450 at a normal temperature. Chemical deposition of TiN on a steel base member 11 at the comparatively low temperature of about 800° to about 850° C. as above indicated is preferred. If the steel base member diameter is 1 mm. or less and is heated to a temperature of about 900° C. or more, both the surface and inside portion of the base member may transform into a brittle structure and easily break when a large fish is being brought in with it.

The preferable thickness of the TiN film of from 1 to 10 microns is due to the fact that under 1 micron the surface of the fishhook is short of corrosion resistance, whereas over 10 microns the film layer peels off the base member when the fishhook is bent as can occur, for example, during fishing.

TiN is excellent in both oxidation resistance and lubrication characteristic. Therefore, this TiN film layer facilitates the finishing work of the fishhook after chemical vapor deposition. A fishhook provided with a TiN film layer formed on a steel base member by chemical vapor deposition has corrosion resistance and abrasion resistance and maintains both the resiliency of the base member and the sharpness of the point and barb of the base member.

In forming the Ti(C,N) film layer, the base member 11 is cleaned and activated, and then, the activated base member 11 is heated in a mixture gas composed of evaporation gas of titanium tetrachloride, methane gas, hydrogen gas and nitrogen gas at about 800° to 1000° C. This results in the mixture gas reacting on the surface of the base member 11 to form the Ti(C,N) film layer thereon.

Ti(C,N) is a solid solution of TiC and TiN, and the composition of Ti(C,N) can be voluntarily changed by changing the ratio of methane gas and nitrogen gas within the mixture gas. Ti(C,N) has both properties of TiC and TiN.

Figure 2B:
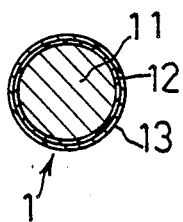

Aluminum oxide is excellent in both oxidation resistance and abrasion resistanct so as to be preferably used as the material for the film layer of the fishhook. However, it is technically difficult to form an aluminum oxide film layer directly on the surface of the base member. Accordingly, the TiC film layer 12 is previously formed on the surface of the base member 11, and an aluminum oxide ($Al_2O_3$) film layer 13 is formed on the TiC film layer 12 as shown in FIG. 2(B).

Namely, the base member 11 on which the TiC film layer 12 is formed, is heated in a mixture gas of evaporation gas of aluminum chloride ($AlCl_3$), carbon dioxide gas and a small amount of hydrogen gas at about 1000° C. This results in the $Al_2O_3$ film layer being formed on the TiC film layer 12. $Al_2O_3$ shows silvery white and has a hardness(Hv) of 2380 at a normal temperature.

Figure 2C:
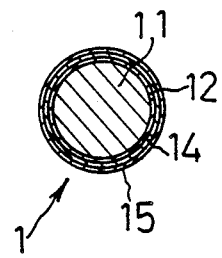

In the fishhook shown in FIG. 2(C), a TiC film layer 12, a Ti(C,N) film layer 14 and a TiN film layer 15 are successively formed on the base member 11. In this fishhook, by interposing the Ti(C,N) film layer 14 between the TiC film layer 12 and the TiN film layer 15, good adhesion is obtained therebetween. And by forming the TiN film layer 15 on the outermost side of the fishhook, it can be easily subjected to finishing work after chemical vapor deposition. Moreover, even if the TiN film layer 15 is broken, the abrasion resistance of the fishhook can be maintained by virtue of the Ti(C,N) film layer and the TiC film layer.

Each of the above described film layers has an thickness of about several microns.

As described above, according to the present invention, the abrasion resistance and corrosion resistance of the fishhook are remarkably improved as compared with the conventional fishhook which is plated with chrome, gold or the like.

Due to the improvement in abrasion resistance, the sharp point of the fishhook and the sharp tip end of the barb thereof can be maintained. Accordingly, the fishhook of the present invention can prevent fishes from being failed to be caught in fishing, or bait from being taken off of the fishhook.

Due to the improvement in corrosion resistance, the fishhooks can be prevented from becoming rusty while being stored over a long period or transported by sea.

Moreover, according to the present invention, dense film layers of a uniform thickness can be formed with good work efficiency by chemical vapor deposition. Accordingly, the fishhook of the present invention can be mass-produced.

What is claimed is:

1. A fishhook consisting of:
    (a) a metallic base member having a fishhook-like shape provided with a point, a barb and a shank, and
    (b) at least one film layer made of a hard metallic compound selected from the group consisting of TiC, TiN and Ti(C,N), which is formed on said base member by chemical vapor deposition, whereby said fishhook resists wear and corrosion.

2. A fishhook according to claim 1, wherein said at least one film layer is a single film layer.

3. A method for producing a fishhook, comprising the steps of:
    (a) forming a metallic base member having a fishhook-like shape provided with a point, a barb and a shank;
    (b) contacting a mixture gas containing an evaporation gas of a metal halide with a surface of said formed base member at a temperature of 800° to 1000° C. to form a film layer made of a hard compound of a metal of said metal halide on said base member.

4. A method according to claim 3, wherein said mixture gas further contains at least one of nitrogen gas and methane gas.

5. A method according to claim 4, wherein said metal halide is titanium tetrachloride and wherein said film layer made of a material selected from the group consisting of TiC, TiN and Ti(C,N) is formed on said base member.

6. A method according to claim 3, further comprising the step of contacting a second mixture gas containing a second evaporation gas of a second metal halide with said film layer at a temperature of 1000° C. to form a second film layer made of a hard compound of a metal of said second metal halide on said film layer.

7. A method according to claim 6, wherein said second metal halide is aluminum chloride, said mixture gas further contains carbon dioxide gas wherein a film layer made of $Al_2O_3$ is formed on said film layer.

8. A fishhook consisting of:
    (a) a metallic base member having a fishhook-like shape provided with a point, a barb and a shank,
    (b) a first film layer made of TiC, formed on said base member by chemical vapor deposition, and
    (c) a second film layer made of $Al_2O_3$ formed on said first film layer by chemical vapor deposition, whereby said fishhook resists wear and corrosion.

9. A fishhook consisting of:
    (a) a metallic base member having a fishhook-like shape provided with a point, a barb and a shank,
    (b) a first film layer made of TiC, formed on said base member by chemical vapor deposition,
    (c) a second film layer made of Ti(C,N) formed on said first film layer by chemical vapor deposition, and
    (d) a third film layer made of TiN formed on said second film layer by chemical vapor deposition, whereby said fishhook resists wear and corrosion.

10. A fishhook consisting of
    (a) a base member made of steel, which has a fishhook-like shape provided with a point, a barb and a shank, and
    (b) a film layer made of TiN, which is formed on said base member by chemical vapor deposition, whereby said fishhook resists abrasion and corrosion.

11. A fishhook according to claim 10, wherein said film layer of TiN has a film thickness of 1 to 10 microns.

12. A method for producing a fishhook, comprising the steps of:

(a) forming a base member out of steel so as to have a fishhook-like shape provided with a point, a barb and a shank:
(b) contacting a mixture gas containing an evaporation gas of titanium halide and nitrogen gas with a surface of said formed base member at a temperature of about 800° to about 850° C. to form a film layer made of TiN on said base member.

13. A fishhook according to claim 12 wherein said film layer of TiN has a film thickness of 1 to 10 microns.

* * * * *